United States Patent
Bernard

(10) Patent No.: US 6,910,497 B2
(45) Date of Patent: Jun. 28, 2005

(54) SEMICONDUCTOR COMPONENT MANUFACTURING PLANT WITH VENTILATED FALSE FLOOR

(75) Inventor: Roland Bernard, Viuz-la-Chiesaz (FR)

(73) Assignee: Alcatel, Paris (FR)

( * ) Notice: Subject to any disclaimer, the term of this patent is extended or adjusted under 35 U.S.C. 154(b) by 258 days.

(21) Appl. No.: 10/426,877

(22) Filed: May 1, 2003

(65) Prior Publication Data

US 2003/0205274 A1 Nov. 6, 2003

(30) Foreign Application Priority Data

May 2, 2002 (FR) .............................. 02 05515

(51) Int. Cl.$^7$ ................................................ B05C 5/00
(52) U.S. Cl. .................. 137/357; 137/565.23; 414/939; 454/187; 118/715
(58) Field of Search .......................... 137/357, 565.23; 414/935, 939; 454/187; 118/715

(56) References Cited

U.S. PATENT DOCUMENTS

| | | | |
|---|---|---|---|
| 4,433,951 A | * 2/1984 | Koch et al. ............... | 414/217 |
| 5,669,814 A | 9/1997 | Takeda | |
| 5,867,881 A | 2/1999 | Hung et al. | |
| 5,900,047 A | * 5/1999 | Rodriguez et al. ........... | 96/243 |
| 5,928,077 A | 7/1999 | Kisakibaru | |
| 6,183,358 B1 | * 2/2001 | Adair, Jr. .................... | 454/187 |
| 6,306,189 B1 | 10/2001 | Renz | |
| 6,316,045 B1 | * 11/2001 | Bernard et al. ............... | 427/8 |
| 6,561,894 B1 | * 5/2003 | Miyajima ................... | 454/187 |
| 6,783,427 B2 | * 8/2004 | Isobe et al. .................... | 451/5 |
| 6,817,377 B1 | * 11/2004 | Reimer et al. ......... | 137/565.23 |

FOREIGN PATENT DOCUMENTS

| | | |
|---|---|---|
| EP | 0 450 142 A2 | 10/1991 |
| JP | 5-156444 A | 6/1993 |
| WO | WO 01/82019 A1 | 11/2001 |

* cited by examiner

Primary Examiner—A. Michael Chambers
(74) Attorney, Agent, or Firm—Sughrue Mion, PLLC

(57) ABSTRACT

According to the invention, a semiconductor component manufacturing plant is constructed in a building having an upper storey and a lower storey separated from one another by a support slab and a false floor. The support slab has passageway openings, whilst the false floor consists of plates themselves having through passages. Vacuum generation means are disposed in an intermediate space situated between the support slab and the false floor which itself carries a process chamber situated in the upper space constituting a clean room. Suction means situated in the lower storey create a gaseous flow directed downwards from the clean room through the intermediate space to the lower storey. In this way, the false floor acts as a non-return mechanism for noise, thermal or chemical pollution coming from the vacuum generation means.

10 Claims, 2 Drawing Sheets

SEMICONDUCTOR COMPONENT MANUFACTURING PLANT WITH VENTILATED FALSE FLOOR

Figure 1:
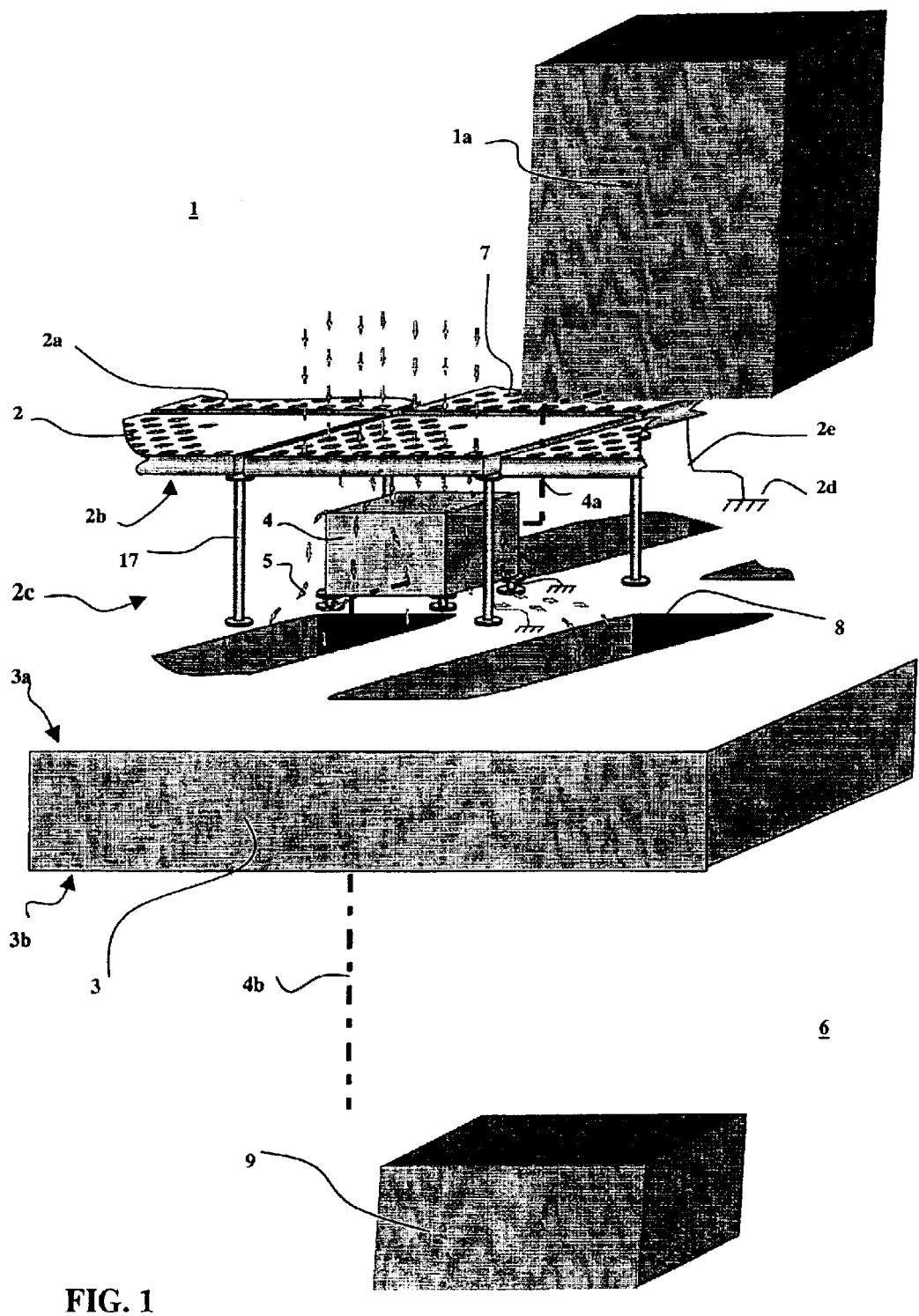

The present invention relates to the means making it possible to integrate at least in part a vacuum pumping line in the intermediate space situated between a support slab and a clean room false floor in a semiconductor component manufacturing plant.

The floor of the clean room of a semiconductor component manufacturing plant generally consists of a false floor surmounting a 90 cm-thick concrete support slab pierced at regular intervals by passageway openings, 80 cm long and 40 cm wide. The passageway openings are used for passing ducts and cables to the basement.

On this support slab there are fixed, with a 60 cm mesh, jack feet of variable height depending on the plant, and on which there rest 60 cm×60 cm juxtaposed and perforated false floor plates made of aluminium. The height of the jack feet can vary between approximately 43 cm and approximately 120 cm, depending on the plant. On the false floor plates there are placed the items of semiconductor component manufacturing equipment, in particular the process chambers. In the volume under the false floor there pass the various ducts and cables necessary for the operation of the equipment placed on the false floor constituted by the false floor plates.

A proposal has recently been made, for example in the document WO 01/82019, to integrate, in the intermediate space between the support slab and the false floor, at least part of the vacuum line, for example a vacuum pumping system consisting of a primary pump possibly with related devices for treatment of pumped gases.

The invention aims to capitalise on the main advantages of such an at least partial integration of the vacuum pumping system in the space between the slab and the false floor:

improvement of the useful pumping capacity, through closeness of the pump and the vacuum chambers situated in the clean room;

saving of space in the basements where the vacuum pumps are traditionally installed;

saving of pumping line, which is long and sometimes heated, from the basement to the machine.

But the closeness of the vacuum production means leads to harmful chemical and physical effects. These harmful effects are liable to interfere with the operation of the process chambers, in which gas plasma micromachining operations take place, these operations being highly sensitive to external interference. And these harmful effects are liable to pollute the clean rooms in which the products are handled before and after micromachining.

The invention aims to avoid the drawbacks of the systems of the prior art, by making it possible in particular to very appreciably reduce the risks of pollution of the clean rooms and process chambers, whilst retaining the proximity of the vacuum generation means.

For this, the idea which is at the root of the invention is to implement an additional isolation between the vacuum generation means and the clean room containing the process chambers, entry and exit lock chambers and transfer chambers, in order to avoid all the following: vibratory pollution, noise pollution, thermal pollution and even chemical and possibly electrical pollution.

To achieve these aims, as well as others, the invention makes provision for a semiconductor component manufacturing plant, in a building having an upper storey and a lower storey separated from one another by a support slab having an upper face and a lower face and supporting a false floor formed from a juxtaposition of false floor plates having an upper face and a lower face, with at least one process chamber placed in the upper storey which in itself constitutes a clean room, and with vacuum generation means for generating and maintaining a controlled vacuum in the process chamber, the vacuum generation means being at least in part placed in an intermediate space situated between the support slab and the false floor, the false floor plates having through passages between their upper face and their lower face, the support slab having passageway openings between its upper face and its lower face; according to the invention, suction means are provided in the lower storey for sucking the atmosphere from the clean room to the lower storey, producing a gaseous flow which travels in the through passages of the false floor plates to the intermediate space, around the vacuum generation means in the intermediate space, and in the passageway openings of the support slab to the lower storey.

Thus, the gaseous flow in the through passages of the false floor plates opposes the backward migration of any gaseous leaks to the clean room, opposes the propagation of heat to the clean room, and opposes the propagation of sounds to the clean room.

The false floor thus acts as a non-return mechanism for noise, thermal or chemical pollution coming from the vacuum generation means integrated under the false floor.

It is important to provide regularity of the gaseous flow around the vacuum generation means. For this, according to one embodiment of the invention, the vacuum generation means are placed above a passageway opening in the lower support slab.

In an alternative, the vacuum generation means are placed opposite a solid area of the lower support slab, between passageway openings.

In all cases, it is advantageous to arrange that the vacuum generation means are kept away from both the upper face of the support slab and the lower face of the false floor plates, in order to allow a free gaseous flow circulation above and below the vacuum generation means.

For example, the vacuum generation means can be supported by a platform resting on the upper face of the support slab by means of connecting legs.

The connecting legs can advantageously be equipped with an elastic and damped link, opposing the transmission of vibrations from the vacuum generation means to the support slab and the false floor.

In order to oppose any electrical pollution coming from the vacuum generation means integrated under the false floor, false floor plates made of an electrically conductive metal and electrically connected to earth can also be used.

In this case, it is advantageous that the false floor plates comprise an upper face covered with a surface layer made of insulating or semi-insulating material. In this way, the proliferation of electrically charged particles in the clean room is avoided.

Figure 2:
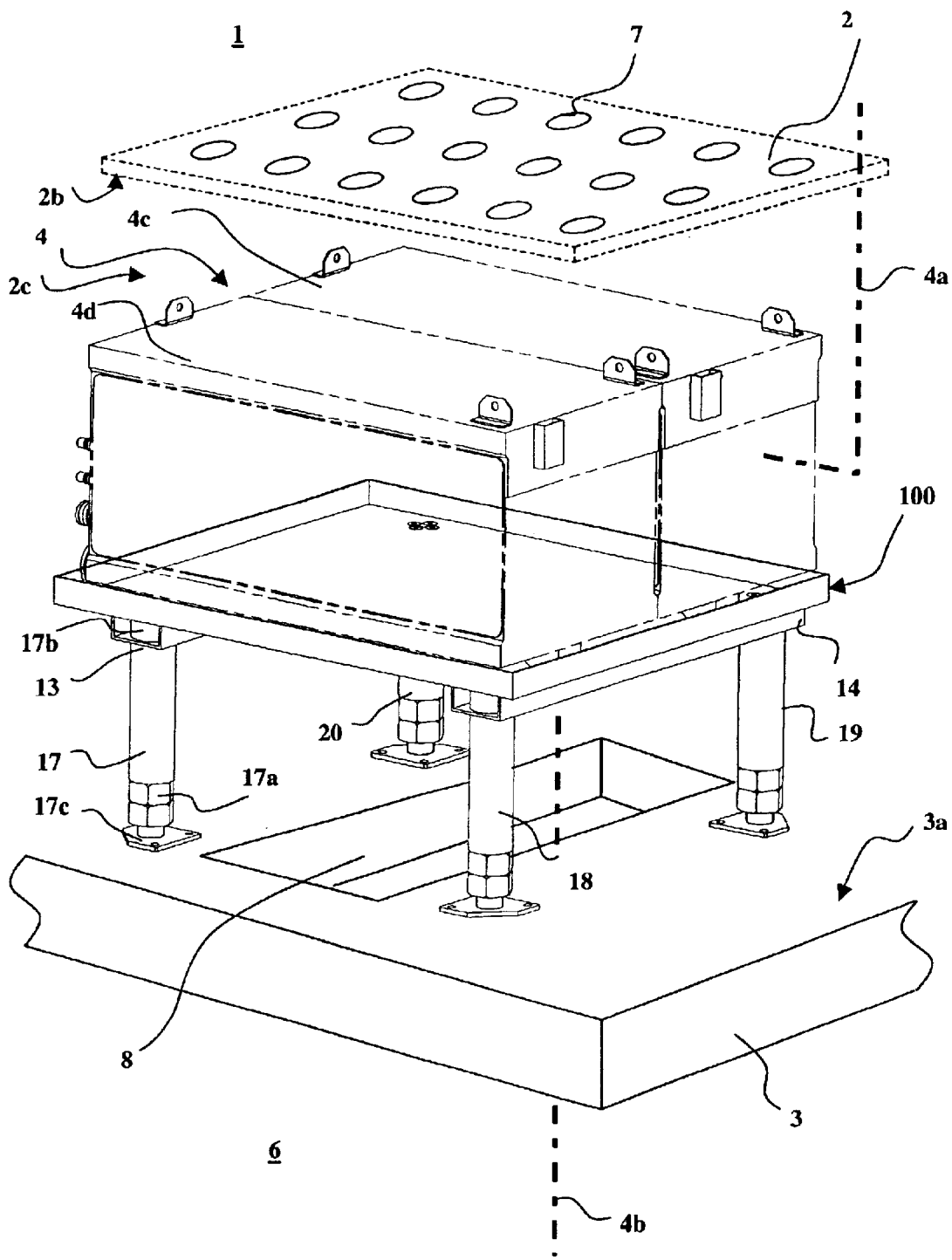

Other objects, characteristics and advantages of the present invention will emerge from the following description of particular embodiments, given in connection with the accompanying figures, amongst which:

FIG. 1 illustrates schematically, in perspective, a semiconductor component manufacturing plant according to one embodiment of the present invention; and FIG. 2 is a schematic view in perspective illustrating one embodiment of the means for holding the vacuum generation means under the false floor.

In the embodiment illustrated in FIG. 1, the semiconductor component manufacturing plant consists of a building having an upper storey 1 and a lower storey 6 separated from one another by a support slab 3 and a false floor 2. The upper storey is itself a clean room, in which the operating personnel move about around at least one process chamber 1a.

The false floor 2 is held away from and above the support slab 3, in order to form an intermediate space 2c.

A vacuum line makes it possible to generate and maintain a low pressure atmosphere inside the process chamber 1a. The vacuum line comprises vacuum generation means 4 which are at least in part placed in the intermediate space 2c situated between the support slab 3 and the false floor 2.

The support slab 3 is for example a concrete slab, having an upper face 3a and a lower face 3b. The support slab 3 has passageway openings 8 between its upper face 3a and its lower face 3b.

The false floor 2 consists of a juxtaposition of false floor plates, for example of rectangular shape, themselves having an upper face 2a and a lower face 2b, with through passages 7 between the upper face 2a and the lower face 2b. The through passages 7 can for example be holes of circular shape and with a diameter of approximately 2 to 4 cm, regularly distributed over the surface of the false floor plate and occupying approximately between one third and half of the surface.

The vacuum generation means 4 are connected to the process chamber 1a by a suction duct 4a systematically illustrated in dotted lines in the figure, and constituted in a known manner.

According to the invention, there are provided in the lower storey 6 suction means 9 making it possible to suck the atmosphere from the clean room 1 to the lower storey 6, thus producing a gaseous flow 5 which travels in the through passages 7 of the false floor plates 2 to the intermediate space 2c, around the vacuum generation means 4 in the intermediate space 2c, and in the passageway openings 8 of the support slab 3 to the lower storey 6.

By virtue of the presence of the small-diameter through passages 7 regularly distributed over the entire surface of the false floor plates 2, the gaseous flow 5 is regularly distributed in the intermediate space 2c all around the vacuum generation means 4, and is regularly distributed in the clean room 1 around the process chamber 1a.

In the embodiment illustrated in FIG. 1, the vacuum generation means 4 are placed above a solid area of the lower support slab 3, between a number of passageway openings such as the passageway opening 8. In this way, the vacuum generation means 4 interfere as little as possible with the flowing of the gaseous flow 5 through the passageway openings 8, so that the gaseous flow 5 sweeps regularly over the side walls of the vacuum generation means 4.

However, the embodiment of FIG. 2 may be preferred, in which the vacuum generation means 4 are placed above a passageway opening 8 in the lower support slab 3. In this way, the formation of a dead area below the vacuum generation means 4 is avoided, an area in which the gaseous flow is reduced and risks leading to an accumulation of polluting particles.

In this embodiment of FIG. 2, the vacuum generation means 4 are moreover kept away from both the upper face 3a of the support slab 3 and the lower face 2b of the false floor plates 2, in order to allow a free circulation of the gaseous flow 5 above and below the vacuum generation means 4.

In this case, the vacuum generation means 4 are supported by a platform 100 which rests on the upper face 3a of the support slab 3 by means of connecting legs 17, 18, 19 and 20. The connecting legs 17–20 preferably have length-adjustment means, for example screw jacks 17a, for adapting the vertical position of the platform 100 with respect to the support slab 3. Each connecting leg 17–20 has an upper end having a vertical shaft 17b fitted in one of a number of holes provided in U-sections 13 or 14 of the platform 100. Each connecting leg 17–20 has at its base a fixing plate such as the plate 17c, which is fixed by screwing or any other means on the support slab 3.

The connecting legs 17–20 can be disposed in a square which is smaller in size than the platform 100.

The support slab 3, for example made of 90 cm-thick concrete, can be pierced at regular intervals to form the passageway openings 8. The passageway openings 8 have for example a size of 80 cm in length and 40 cm in width, and are used not only for passage of the gaseous flow 5 but also for passing the ducts and cables between the intermediate space 2c and the lower storey 6.

Referring again to the embodiments of FIG. 1, it is perceived that the false floor plates 2 are connected to earth 2d by an electrical connection 2e. In this case, the false floor plates 2 are made of an electrically conductive metal, in order to form an equipotential barrier opposing the propagation of electromagnetic waves from the vacuum generation means 4 to the clean room 1.

In this case also, the false floor plates 2 can advantageously comprise an upper face 2a covered with a surface layer made of an electrically insulating or semi-insulating layer. For example, a polymer layer can be used, which avoids charging the particles situated in the atmosphere of the clean room 1.

The vacuum generation means 4 placed in the intermediate space 2c can comprise one or more vacuum pumps 4c (FIG. 2) connected in series, linked by the suction duct 4a to at least one process chamber 1a, and discharging the pumped gases through a discharge duct 4b to the atmosphere. The vacuum generation means 4 can comprise means for analysis and/or treatment of the discharged gases 4d, placed in the intermediate space 2c and/or in the lower storey 6.

The present invention is not limited to the embodiments which have been explicitly described, but includes the various variants and generalisations thereof which are within the capability of persons skilled in the art.

What is claimed is:

1. A semiconductor component manufacturing plant, in a building having an upper storey and a lower storey separated from one another by a support slab having an upper face and a lower face and supporting a false floor formed from a juxtaposition of false floor plates having an upper face and a lower face, with at least one process chamber placed in the upper storey which in itself constitutes a clean room, and with vacuum generation means for generating and maintaining a controlled vacuum in the process chamber, the vacuum generation means being at least in part placed in an intermediate space situated between the support slab and the false floor, the false floor plates having through passages between their upper face and their lower face, the support slab having passageway openings between its upper face and its lower face, wherein suction means are provided in the lower storey for sucking the atmosphere from the clean room to the lower storey, producing a gaseous flow which travels in the through passages of the false floor plates to the intermediate space, around the vacuum generation means in the intermediate space, and in the passageway openings of the support slab to the lower storey.

2. A plant according to claim 1, wherein the vacuum generation means are placed above a passageway opening in the lower support slab.

3. A plant according to claim 1, wherein the vacuum generation means are placed above a solid area of the lower support slab between passageway openings.

4. A plant according to claim 1, wherein the false floor plates are made of an electrically conductive metal and are electrically connected to earth.

5. A plant according to claim 4, wherein the false floor plates comprise an upper face covered with a surface layer made of an electrically insulating or semi-insulating material.

6. A plant according to claim 1, wherein the vacuum generation means are kept away from both the upper face of the support slab and the lower face of the false floor plates, in order to allow a free gaseous flow circulation above and below the vacuum generation means.

7. A plant according to claim 6, wherein the vacuum generation means are supported by a platform resting on the upper face of the support slab by means of connecting legs.

8. A plant according to claim 7, wherein the connecting legs are equipped with an elastic and damped link opposing the transmission of vibrations.

9. A plant according to claim 1, wherein the vacuum generation means placed in the intermediate space comprise one or more vacuum pumps connected in series, linked by a suction duct to at least one process chamber, and discharging the pumped gases through a discharge duct to the atmosphere.

10. A plant according to claim 9, wherein the vacuum generation means comprise means for analysis and/or treatment of the discharged gases, placed in the intermediate space and/or in the lower storey.

* * * * *